United States Patent

[11] 3,628,106

[72] Inventors John N. Frank
Ballwin, Mo.;
William M. Robinson, Skaneateles, N.Y.

[21] Appl. No. 821,688
[22] Filed May 5, 1969
[45] Patented Dec. 14, 1971
[73] Assignee General Electric Company

[54] PASSIVATED SEMICONDUCTOR DEVICE WITH PROTECTIVE PERIPHERAL JUNCTION PORTION
4 Claims, 10 Drawing Figs.

[52] U.S. Cl. .......... 317/234 R, 317/235 AJ, 317/235 AA, 317/235 AB, 317/235 F, 317/234 F, 317/235 R
[51] Int. Cl. .......... H01l 9/12, H01l 19/00
[50] Field of Search .......... 317/235, 234, 235 (47), 235 (41.1), 235 (22.11), 234 (3), 234 (3.1), 235 (47.1), 235 (3.1)

[56] References Cited

UNITED STATES PATENTS

| | | | |
|---|---|---|---|
| 3,437,886 | 4/1969 | Edquist | 317/234 |
| 3,241,010 | 3/1966 | Eddleston | 317/234 |
| 3,316,465 | 3/1967 | Von Bermuth et al. | 317/234 |
| 3,283,224 | 11/1966 | Erkan | 317/234 |
| 3,492,174 | 1/1970 | Nakamura et al. | 148/175 |
| 3,210,563 | 10/1965 | New | 307/88.5 |
| 3,280,386 | 10/1966 | Philips | 317/234 |

FOREIGN PATENTS

| | | | |
|---|---|---|---|
| 1,030,669 | 5/1966 | Great Britain | 317/235 (41.1) |

*Primary Examiner*—John W. Huckert
*Assistant Examiner*—Martin H. Edlow
*Attorneys*—Robert J. Mooney, Nathan J. Cornfeld, Carl O. Thomas, Frank L. Neuhauser, Oscar B. Waddell and Joseph B. Forman

ABSTRACT: A semiconductive crystal is provided with a first zone lying adjacent a first major surface having a central portion and a peripheral portion extending toward a remaining major surface. A second zone lies adjacent the second major surface. A central zone of higher resistivity and greater thickness than either the first and second zones lies between the zones forming junctures therewith. A passivant associated with the second major surface overlies the intersection of the junctures with the edge of the crystal. The passivant may be a glass layer contained in a groove spaced inwardly from the edge of the crystal.

Figure 6:
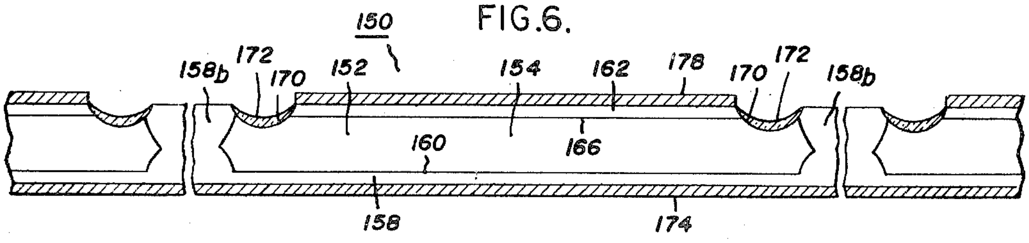

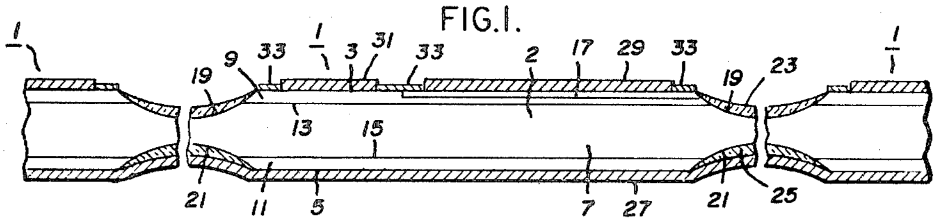
FIG. 1.
FIG. 2.
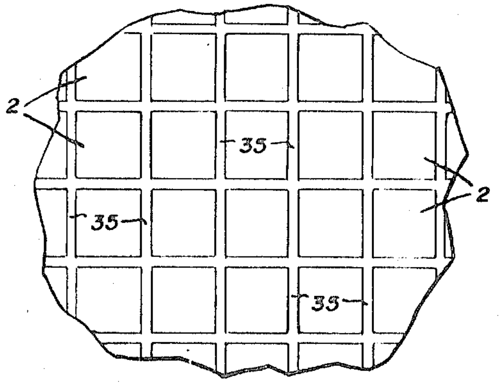
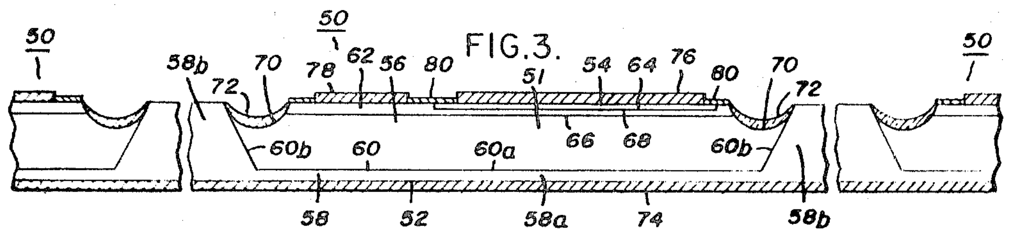
FIG. 3.
FIG. 4.
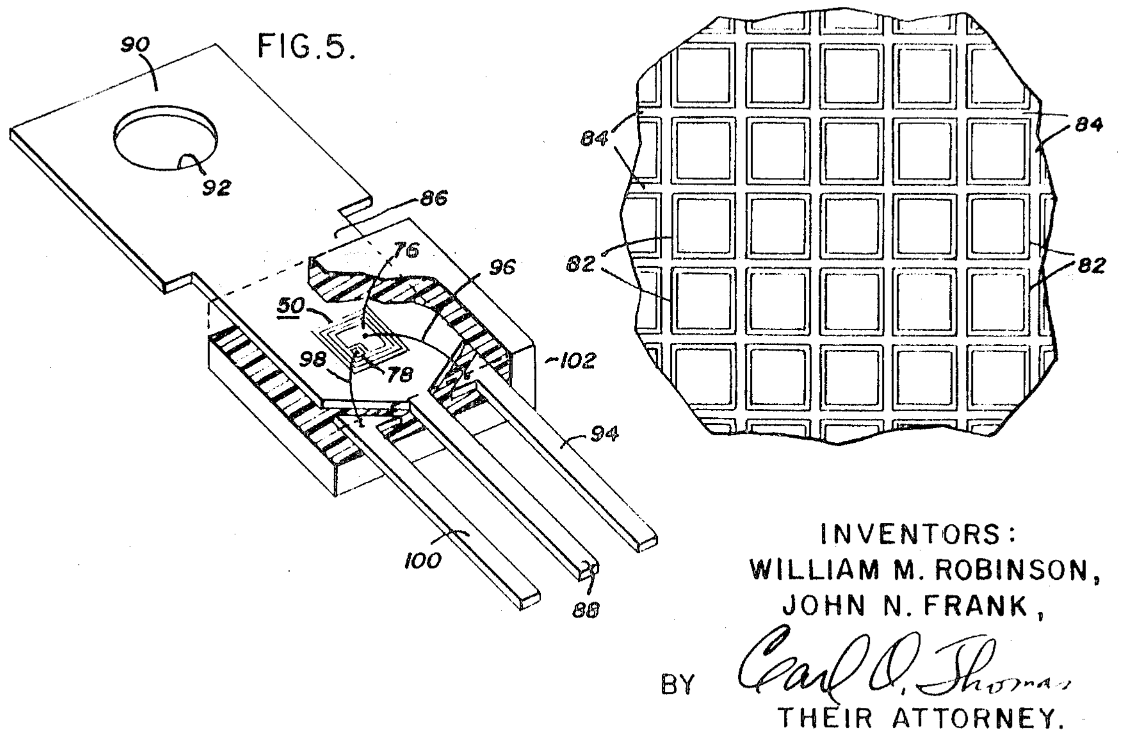
FIG. 5.
INVENTORS:
WILLIAM M. ROBINSON,
JOHN N. FRANK,
BY Carl O. Thomas
THEIR ATTORNEY.

INVENTORS:
WILLIAM M. ROBINSON,
JOHN N. FRANK,

BY Carl O. Thomas
THEIR ATTORNEY.

PASSIVATED SEMICONDUCTOR DEVICE WITH PROTECTIVE PERIPHERAL JUNCTION PORTION

Our invention is directed to a semiconductor device having a semiconductive crystal associated with a junction passivant in a manner to improve the electrical properties of the semiconductor device and the mechanical properties of the passivated semiconductive crystal.

It is by now well understood how to manufacture semiconductor devices capable of blocking extremely high voltage differentials across their terminals. Unfortunately, the structural arrangements which result in the most desirable electrical characteristics have been largely limited in applicability to manufacturing approaches in which each semiconductive crystal or pellet to be incorporated into a semiconductor device is separately processed and handled.

Because of the extreme cost competitiveness of the semiconductor industry, manufacturing techniques have been developed capable of simultaneously processing semiconductive crystals or pellets for a large number of semiconductor devices while still associated within a single large crystalline disc or wafer. Wafer processing has greatly reduced the unit cost of semiconductive crystals and hence the cost of the semiconductor devices. However, the advantages of mass handling of semiconductive pellets are obtained only by accepting relatively low level electrical performance capabilities and by the necessity of rejecting substantial quantities of completed semiconductor devices due to semiconductive crystal damage produced in fabrication. For example, whereas four layer, three junction thyristor pellets can be individually manufactured capable of reliably providing semiconductor devices capable of blocking terminal applied potentials well in excess of 1,000 volts, thyristors having semiconductive crystals formed and processed en masse typically exhibit voltage blocking characteristics well below 400 volts. This is no disadvantage to applications requiring low blocking voltage capabilities, but, obviously, the range of applications for such devices are limited by this parameter. Further, a substantial number of the semiconductor devices produced by such mass handling techniques must be discarded or downgraded as failing to meet even these modest performance criteria due to mechanical damage in processing and assembly.

It is an object of our invention to provide a semiconductor device incorporating a semiconductive crystal having a structure compatible with low cost, multiple pellet handling and fabricating techniques which exhibits improved electrical characteristics and which is less susceptible to in process damage. It is a more specific object of our invention to provide a conveniently manufacturable semiconductor device of improved blocking voltage characteristics.

These and other objects of our invention may be realized in one form by the combination comprised of a semiconductor crystal having first and second major surfaces. A central zone lies between and spaced from the major surfaces and is of a first conductivity type. First and second zones lie between the central zone and the first and second major surfaces, respectively, of the semiconductor crystal. The central zone exhibits a greater width and a higher resistivity than either of the first and second zones. The central zone forms first and second junctures with the first and second zones, respectively. The first juncture has a central portion and a peripheral portion extending away from the first major surface toward the second major surface. A dielectric passivant means is associated with the semiconductive crystal intersecting the peripheral portion of the first juncture at a point more remote from the first major surface than the central portion.

Figure 7:
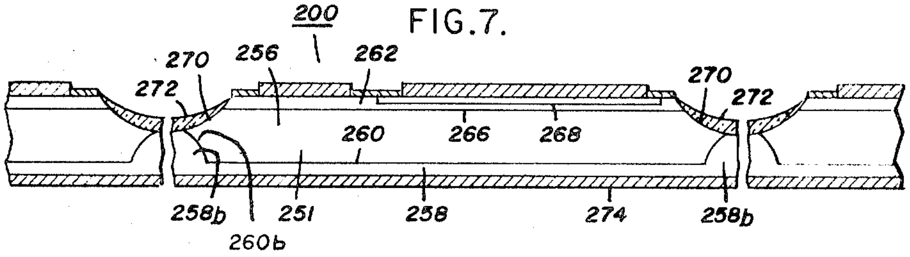
Figure 9:
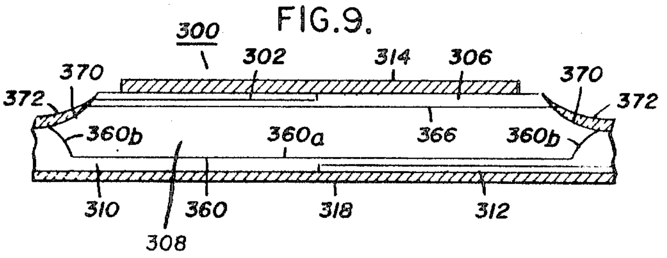
Figure 8:
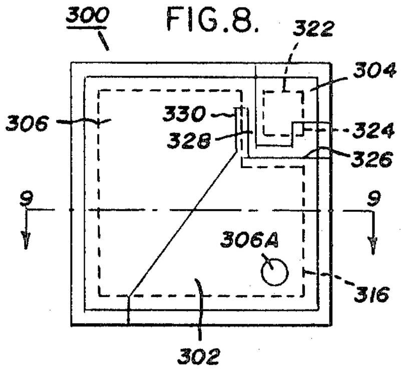
Figure 10:
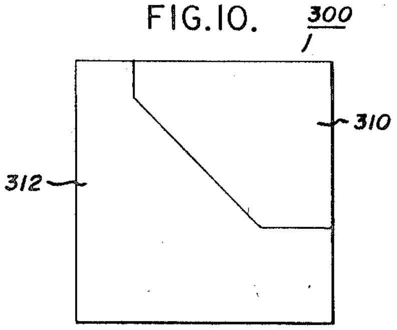

Our invention may be better understood by reference to the following detailed description considered in conjunction with the drawings, in which FIG. 1 is a vertical section of conventional semiconductive assemblies as they would appear immediately after separation from a common wafer, FIG. 2 is a detail of a wafer from which the assemblies of FIG. 1 may be formed, FIG. 3 is a vertical section of semiconductive assemblies according to our invention as they would appear immediately after separation from a common wafer, FIG. 4 is a detail of a wafer from which the assemblies of FIG. 3 may be formed, FIG. 5 is an isometric view of a semiconductor device formed according to our invention with a portion shown in section, FIG. 6 is a vertical section of alternate semiconductive assemblies according to our invention as they would appear immediately after separation from a common wafer, FIG. 7 is a vertical section of additional semiconductive assemblies according to our invention as they would appear immediately after separation from a common wafer, FIG. 8 is a plan view of still another form of a semiconductive assembly formed according to our invention with the contacts indicated by dashed lines, FIG. 9 is a section taken along line g–9 in FIG. 8, and FIG. 10 is a bottom view of the semiconductive assembly of FIGS. 8 and 9, but with the lower contact removed.

An appreciation of our invention and its distinct advantages can be readily gained by comparison with a conventional structure now in commercial use. In FIG. 1 a plurality of conventional semiconductive assemblies 1 are shown as they would appear immediately after being subdivided from a single large crystalline disc or wafer. Each of the assemblies is formed of a semiconductive pellet or crystal 2 having first and second major surfaces 3 and 5 which are substantially parallel. The crystal is provided with a central zone 7 which is typically of N-type conductivity. A first zone 9 and a second zone 11 of P-type conductivity are interposed between the central zone and the first and second major surfaces, respectively, and form junctions 13 and 15 with the central zone. A third zone 17 is interposed between a portion of the first zone and the first major surface, but spaced from the central zone. Typically the third zone is formed of N+ conductivity. The periphery of each crystal is provided with an upper curved edge 19 that intersects the peripheral edge of the junction 13 and a lower curved edge 21 that intersects the peripheral edge of the junction 15. Glass passivant layers 23 and 25 are associated with the upper and lower curved edges to protect the junctions 13 and 15. A metallic contact 27 overlies the lower surface of the semiconductive crystal and the passivant layer 25. The contact is comprised of one or more metal layers that provide an ohmic contact to the second layer 11. A contact 29 is associated with the third zone in ohmically conductive relation. A control contact 31 ohmically engages a portion of the first zone lying along the first major surface. The portion of the upper surface of the semiconductive crystal not covered by glass passivant or contacts is protected by a thin nitride or oxide layer 33, typically silicon dioxide or nitride.

It may be readily seen that the semiconductive assemblies 1 when associated with terminal leads and casings are each suited to form the semiconductively active portion of a semiconductor controlled rectifier. Typically the contact 27 would be associated with an anode lead, the contact 29 with a cathode lead, and the contact 31 with a gate or control lead. As a controlled rectifier the junction 13 must block the forward voltage prior to switching to a conductive mode by a proper gate signal, and the junction 15 must withstand peak inverse voltages.

The semiconductive crystals 2 of the assemblies 1 of FIG. 1 are initially joined in a single crystalline wafer. Initially the wafer exhibits the conductivity characteristics of the central zone 7. The junctions 13 and 15 and zones 9 and 11 are formed by diffusing from the first and second major surfaces. The third zone 17 may be formed by diffusion or by alloying. In order to passify the junctions at the edge of each crystal assembly aligned grooves may be etched from the opposite major surfaces to form the curved edges 19 and 21 that intersect the junctions 13 and 15, respectively. The glass passivant layers 23 and 25 are then deposited in the grooves. The contacts are typically applied after the glass passivant layers are fully formed. Where the contact 27 is applied by vapor plating it may overlie the glass 25 as shown. It is appreciated that the metal contacts may be of any conventional type and are typically formed of a plurality of different metals and metal layers. The wafer is subdivided into individual assemblies 1 only after each of the above operations have been fully accomplished. Thus, a very low cost process of fabrication is afforded, since each step may be preformed simultaneously on each semiconductive crystal 2 while it is contained in the wafer and, usually, a plurality of wafers may be simultaneously processed.

While the semiconductive assemblies 1 have been shown to meet commercial requirements, they nevertheless exhibit certain disadvantages. First, in forming aligned grooves in a wafer containing the semiconductive crystals, the wafers are substantially weakened along spaced parallel planes running in two directions as is shown in FIG. 2. It can be seen that each semiconductive crystal 2 is integrally joined with adjacent crystals 2, but the grooves 35 separating and demarcating the crystals substantially weaken this integral interconnection and greatly weaken the wafer viewed as a whole. This then requires that the wafers be carefully treated in processing to avoid inadvertent breakage along the grooves. Another disadvantage is that the glass passivant must be placed in the grooves associated with both major surfaces. Many conventional glass application processes are unsuited for the simultaneous application of glass to opposed major surfaces. Accordingly, glass application to the grooves of the opposed major surfaces may be required to be performed sequentially. This is a distinct disadvantage, since glass application processes are frequently comprised of a large number of consecutive steps and frequently the process must be repeated in order to build up an acceptable glass thickness in a groove. If the glass utilized exhibits a thermal coefficient of expansion substantially different from that of the semiconductive wafer, it has been observed that the structural weakening of the wafer attributable to the grooves will allow the glass to bow the wafer. This creates difficulties in attempting accurate mask alignments in subsequent processing steps and is a source of wafer breakage. Another disadvantage is that when semiconductive assemblies are subdivided along the glass grooves by scribing and sawing, the glass associated with both the upper and lower grooves must be fractured. Since glass is typically a brittle material, this affords an opportunity to introduce cracks into the glass that will allow contaminants to penetrate to the blocking junctions. An adverse effect on the voltage blocking characteristics of the device follows. Further disadvantages are attributable to the fact that the central zone extends outwardly to the scribed or sawn edge. Thus if the glass layer 25 is fractured or if solder associated with the contact 27 in mounting the assembly to a heat sink or lead inadvertently touches the sawn edge of the crystal, the central zone may be shorted to the anode terminal of the semiconductor device through this path. Even if neither of these possible sources of shorting occur, however, performance may still be compromised. Since the central zone typically has a much lower impurity level than the first and second zones, the space charge region which is associated with a junction in the blocking state will spread farthest from the junction in the central zone. If the depletion layer spreads sufficiently to contact the sawn edge of the central zone, a softening of the breakdown characteristics of the crystal occurs, possible attributable to surface charge or impurities at the sawn edge. Yet another disadvantage of the semiconductive assemblies 1 is that the portion of each crystal extending beyond the major surfaces are cantilevered when the crystal is mounted into a semiconductor device. Since semiconductive crystals are typically quite thin, usually only a few mils, the cantilevered edges are quite fragile and easily damaged in handling and mounting the crystals. A further disadvantage is that the curved edges 19 and 21 form negative bevel angles with the junctions 13 and 15, respectively. As is well understood in the art negative bevel angles unless controlled within relatively narrow limits tend to predispose crystals toward surface rather than avalanche breakdown when exposed to terminal applied potentials in the blocking state.

In FIG. 3 a plurality of semiconductive assemblies 50 are shown generally comparable to the conventional semiconductive assemblies 1, but incorporating certain unique structural features characteristic of our invention. The assemblies are each comprised of a semiconductive crystal 51 having first and second spaced, substantially parallel major surfaces 52 and 54. A central zone 56 is incorporated within the crystal of a first conductivity type, typically N-type conductivity. A first zone 58 is interposed between the central zone and the first major surface 52. The first zone may be seen to be made up of a central portion **58*a* and an annular portion 58*b* lying adjacent the edge of the crystal and extending between the first and second major surfaces. The first zone is of a conductivity type differing from that of the central zone, typically of P-type conductivity, and forms a first junction 60 with the central zone. It is to be noted that the first junction includes a central portion 60*a* that lies substantially parallel with the first major surface and is laterally spaced inwardly from the edge of the semiconductive crystal. A second, peripheral portion 60*b*** of the first junction is noted to form a peripheral continuation of the central portion of the first junction. The peripheral portion is noted to extend away from the first major surface toward the second major surface. The peripheral portion of the first junction is in all instances more remote from the first major surface than the central portion of this junction.

A second zone 62 lies between the central zone and the second major surface of the crystal. A third zone 64 is interposed between a portion of the second zone and the second major surface. The third zone is spaced from the central zone and generally lies along the second major surface. Where the central zone is of N-type conductivity, the second zone is of P-type conductivity and the third zone is of $N^+$-type conductivity. The second zone forms a junction 77 with the central zone, while the second and third zones form a junction 68. A groove 70 is spaced inwardly from the edge of the semiconductive crystal and extends inwardly from the second major surface of the crystal. The groove intersects the edge of the peripheral portion **60*b* of the junction 60 and the edge of the junction 66**.

Located within the groove is a dielectric passivant material 72, typically a layer of a dielectric glass. It is noted that the entire lower edge of the semiconductive crystal lies along the first major surface and the entire first major surface is covered by a first ohmic conductive contact layer 74. A second contact layer 76 is similarly associated with the third zone at the second major surface. A third or control contact layer 78 is similarly associated with a portion of the second zone lying adjacent the second major surface. The portion of the second major surface not covered by the second and third contact layers are covered with a metal oxide layer 80, which is typically silicon dioxide when the crystal is formed of silicon.

The semiconductive crystals 51 of FIG. 3 may be initially joined in a single crystalline wafer. Preferably the wafer initially exhibits the conductivity characteristics of the central zone 56. The major surfaces 52 and 54 of the wafer may be masked with a metal oxide, such as silicon dioxide, or with any other conventional diffusion masking material. The masking material is then selectively stripped from the major surfaces along a first set of parallel corridors which lie along both the major surfaces and which are in alignment on the opposite major surfaces. A second set of parallel corridors are oriented to intersect the first set and are likewise in alignment on the opposite major surfaces. The first and second sets of corridors are usually simultaneously formed. The general pattern may be similar to that shown in FIG. 2, if it is assumed that in this instance the reference numerals 35 are directed merely to bared corridors rather than grooves.

The wafer is exposed to a diffusant which penetrates the wafer along the corridors to form the edge portions **58*b* of the first zone 58**. Where the wafer was initially of N-type conductivity, the edge portion of the first zone would be formed by a P-type diffusant. With thin wafers diffusion may be accomplished from one major surface rather than both, if desired. Next, the masking material may be removed from both major surfaces and diffusion of both major surfaces accomplished to form the central portion 58*a* of the first zone and the second zone. Thereafter, masking material may be reapplied to the first and second major surfaces, except that the masking material may be omitted or removed from the areas of the second major surface at which it is desired to form the third zones 64.

In a preferred, somewhat varied approach applicable to silicon dioxide masking material, the steps of removing the silicon dioxide from the entire first and second major surfaces to form the central portion of the first zone and the second zone may be omitted. In this approach silicon dioxide is restored over the corridors and is removed only from the areas corresponding to the third zones. Gallium arsenide is used as a diffusant. As is well understood in the art gallium readily penetrates the silicon dioxide mask to form the central portion of the first zone and the second zone while the arsenic forms the N-type third zone. The silicon dioxide prevents arsenic penetration into the first or second zones, however.

After diffusion is completed, masking material is selectively removed from areas on the second major surface overlying the desired location of the grooves. The configuration is best appreciated by reference to FIG. 4, in which a plurality of bared annular areas 82 corresponding in configuration to the desired configuration of the grooves 70 are formed spaced apart by intersecting streets 84. Exposing the second major surface to etchant over the bared areas 82 forms the grooves 70. It is to be noted that the grooves are formed of a width to intersect both the peripheral portion 60*b* of the junction 60 and the edge of the junction 66. Thereafter the passivant layers 72 may be selectively deposited in the grooves by known techniques. For example, a glass passivant may be selectively deposited electrophoretically in the grooves as disclosed in Sheldon commonly assigned application Ser. No. 782,093, filed Dec. 9, 1968, titled Semiconductor Passivating Process and Product, the disclosure of which application is here incorporated by reference. With the passivant deposited in the grooves, the masking material may be entirely removed from the first major surface and selectively removed from the second major surface to allow application of the contact layers 74, 76, and 78 by conventional techniques. The individual semiconductive assemblies 50 may then be separated from the wafer by sawing or scribing along the streets 84 between the glass layers.

In FIG. 5 a semiconductive assembly 50 is shown mounted on an electrically and thermally conductive heat sink 86. The contact layer 74 which covers the first major surface of the semiconductive crystal effectively unites it in intimate thermally and electrically conductive relation to the heat sink. The heat sink is provided along one edge with an integrally formed terminal lead 88. Along a spaced edge the heat sink is provided with a tab 90 having an aperture 92 to facilitate mounting of the semiconductor device and heat removal from the heat sink. The contact layer 76 overlying the third zone of the semiconductive crystal is connected to a terminal pin 94 by a fly wire 96. A second fly wire 98 connects the contact layer 78 associated with the second zone with a terminal pin 100. A plastic housing 102 sectioned horizontally in the same plane as the lower surface of the heat sink is shown (partially indicated in dashed outline) enveloping the heat sink and the inner extremities of the terminal leads. The plastic housing is preferably formed of a synthetic resin having high dielectric properties, such as silicone, phenolic, or epoxy resins. The plastic not only protects the semiconductive assembly but also serves to mount the terminal leads 94 and 100 in the desired orientation with respect to the heat sink.

The semiconductor device shown in FIG. 5 not only exhibits outstanding electrical characteristics, but is also of a construction rendering it conveniently manufacturable. Comparing the semiconductive assembly 50 with the semiconductive assembly 1, a number of distinct advantages are in evidence. By comparing FIGS. 2 and 4 it can be seen that the etching pattern used to form the assemblies 50 leaves a much stronger wafer after etching than with the conventional approach. This is because the wafer of FIG. 2 is joined only by thinned regions underlying the grooves 35. By contrast it can be seen in FIG. 4 that the streets of this wafer form an unweakened interconnecting matrix retaining rigidity and strength in the wafer even after etching. An additional factor that contributes to wafer strength following our approach is that the grooves are formed from one side only, so that the double weakening effect of aligned grooves formed from opposite major surfaces is avoided. Still another distinct advantage of our approach leading to greater wafer strength and hence less in process loss and damage is that the grooves 70 may be quite shallow although formed from only one major surface, since the peripheral portion 60*b* of the lower junction rises to intersect the groove.

The semiconductive assembly 50 is superior to the assembly 1 also in that the glass passivant layer is more reliably protected against damage. Whereas to form the assembly 1 two glass layers must be drawn or scribed around the entire periphery of the semiconductive crystal, thereby providing a relatively high probability of damage, in separating the assemblies 50 from a wafer the scribing or sawing is confined to the streets and entirely avoids contact with the glass passivant layer. Hence a low likelihood of damage of the glass passivant layer exists. Still further, it is to be noted that the passivant layer is spaced inwardly from the edge of the crystal 51 so that the possibility of damage by mechanical shocks in handling is minimized. This is in direct contrast to the assembly 1 in which two glass layers are located at the edge and are supported by a fragile cantilevered edge portion of the crystal. Still another important feature is that the glass in order to protect both blocking junctions of the crystal need only be applied from one major surface.

In addition to mechanical and fabrication advantages the assembly 50 also possesses distinct electrical advantages over the assembly 1. The central zone which is of the greatest width and high resistivity in both the crystals 2 and 51 is protected from direct exposure in the later crystal. This means that no matter how large a voltage is being blocked the depletion layer at no time comes into contact with an unpassivated edge of the crystal. Accordingly, there is no contribution to softening of the blocking characteristics of the crystal from this source. Additionally, it is to be noted that even if some metallization is inadvertently brought into contact with the sawn or scribed edge of the crystal 51, this cannot have the effect of shorting the central zone, since the annular portion 58*b* of the first zone completely surrounds the central zone. Should metal inadvertently contact the annular portion of the first zone as, for example, in uniting the contact layer 74 to the heat sink 86 no deleterious effect on electrical performance is observed. Still further, it is to be noted that the peripheral portion 60*b* of the junction 60 may be formed to intersect the groove 70 at an acute angle which is a positive angle. Whereas the tendency toward surface breakdown at the junction 15 may be aggravated by a negative bevel angle, in our improved configuration surface blocking characteristics are enhanced by the positive bevel so that the crystal 51 may be predisposed toward avalanche rather than surface breakdown.

From the foregoing it is apparent that the semiconductive assembly 50 is superior in both mechanical handling and electrical performance characteristics to the semiconductor assembly 1. However, these advantages are not bought at the price of complicated or undesirable manufacturing techniques. Rather, the semiconductive assembly 50 may be formed by wafer processing even more easily and conveniently than the semiconductive assembly 1.

The remainder of the semiconductor device shown in FIG. 5 is also susceptible to low-cost manufacturing techniques. Initially the heat sink 86 and the terminal leads 94 and 100 may be integrally associated in a metal plate having many similar heat sinks and terminal leads laterally spaced. Mounting of the semiconductive assemblies 50 on the heat sinks may be accomplished very rapidly, since only approximate location is required. After the fly wires are attached, the housing 102 for each of the semiconductor devices to be formed from a single metal plate may be simultaneously formed. Thereafter the heat sink and terminal leads are lanced free of the remainder of the metal plate to form the completed device.

While we have described our invention with specific reference to a semiconductor controlled rectifier, it is appreciated that it may be applied to differing forms of semiconductor devices. For example, a thyristor switched by avalanche effects rather than a gate signal may be formed merely by omitting the contact layer 78 from the semiconductive assembly 50. Another exemplary rectifier application of our invention is illustrated in FIG. 6 in which a semiconductive assembly 150 is shown formed of a semiconductive crystal 152. The crystal is provided with a central zone 154 which may be of relatively low conductivity N-type or P-type or even intrinsic semiconductive material. A first zone 158 is provided which is similar to first zone 58 in configuration, except that the peripheral portion **158*b* differs from peripheral portion 58*b* slightly in internal contour. The first zone 158 may be of either N-type or P-type conductivity and will be of lower resistivity than the central zone and of lesser width. The first and central zones form a juncture 160 therebetween similar to the junction 60. As employed herein the term "juncture" refers to the locus of a relatively abrupt change in conductivity characteristics. At the interface of N-type and P-type conductivity regions the juncture may be a rectifying junction. In other instances where the first and central zones are both of like conductivity type or the central zone is essentially intrinsic the juncture is formed as a result of a relatively abrupt or steeply graded change in the dopant impurity concentration at this location within the crystal. A second zone 162 which may be of either N-type or P-type conductivity, but which is chosen to be of opposite conductivity type from the first zone, forms a juncture 166 with the central zone. A circumferential border groove 170 intersects the junctures 160 and 166 and incorporates therein a passivant layer 172 overlying these junctures. Contact layers 174 and 178** overlie first and second major surfaces of the semiconductive crystal in ohmic association with the first and second zones, respectively.

In FIG. 7 a semiconductive assembly 200 is shown generally similar to the semiconductive assembly 50, but with a somewhat modified arrangement for passifying the junctions. The zones 256, 258, 262, and 268 as well as junctions 260, 266, and 268 are similar to the zones and junctions of FIG. 3 identified by like reference characters lacking the 2 prefix. The sloped peripheral edge 270 of the crystal 251 differs notably from the groove 70 of the crystal 51. The sloped edge intersects the peripheral edge of the junction 266 and the peripheral portion **260*b* of the junction 260. A passivant layer 272 overlies the intersection of the junctions with the sloped edge. The remaining elements of the assembly 200 as well as its arrangement in a semiconductor device may be generally similar to that previously discussed in connection with assembly 50**.

The semiconductive assembly 200 affords a number of advantages attributable to our invention. Comparing this semiconductive assembly with the conventional assembly 1, it can be seen that no fragile cantilevered edge of the crystal is present in the assembly 200. Further, the edge is thicker, since wafer etching from only one major surface is required to form the sloped edge. The contact layer 274 firmly supports the outer edge of the crystal so that its susceptibility to damage is reduced. At the same time the annular portion **258*b* of the first zone isolates the central zone from the drawn or scribed edge of the crystal to avoid shorting on mount down or adverse effects on electrical breakdown characteristics, as has been previously discussed. It is to be noted that only one groove need be etched in a wafer surface to form the sloped surface 270 for both a given crystal 251** and each of its contiguous neighbors. This allows closer spacing of assemblies in a wafer and hence a savings in semiconductive material.

FIGS. 8 through 10 inclusive illustrate the applicability of our invention to a gate-controlled thyristor or triac assembly 300. The semiconductor assembly 300 is provided with a first layer 302 and a gate layer 304 which are laterally spaced and of like conductivity type. Both the first and gate layers form junctions with a second layer 306 of opposite conductivity type. A central layer 308 and emitter layer 312 are of like conductivity type as layers 302 and 304 while fourth layer 310 is of like conductivity type as layer 306. It can thus be seen that in a section through the first layer area the semiconductive element may include a PNPN or NPNP sequence of layers, except for a small area 306A where the second layer 306 extends upwardly through the first layer 302 and only a three layer sequence is present. It can also be seen that a section through the gate layer 304 may include a PNPNP or NPNPN sequence of layers. A contact layer 314 overlies the area defined by dashed lines 316 adjacent one major surface while a second contact layer 318 overlies the entire opposite major surface of the crystal. It is to be noted that both the first and second bonding assemblies overlie both P and N conductivity-type regions. A gate contact layer, not shown, overlies the area 322 primarily overlying a portion of the gate layer 304. A small areal portion of the gate contact layer overlies an area 324, which is part of a somewhat larger area 326 of the layer 306. The surface interconnection of the area 326 to the main surface portion of the layer is through a thin and indirect connecting portion 328. It can be seen that the connecting portion 328 is thin because of the close spacing of the first and gate layers and because of a projecting finger portion 330 associated with the first layer. Since the layer 306 underlies both the first and gate layers the portion 326 is not dependent on the connecting portion 328 for electrical interconnection with the major portion of the layer 306, but rather this connecting portion serves primarily merely to electrically separate the gate and first layers.

The triac assembly 300 is provided with a peripheral sloped edge 370 that intersects junction 366 and 360 which are formed at the interface of the central layer with the second and fourth layers, respectively. It is noted that junction 360 is provided with a central portion **360*a* and a peripheral portion 360*b* that slopes upwardly into intersection with the sloped edge. A passivant layer 372 overlies the sloped edge and lies in intimate contact with the periphery of the junctions 366 and 360. Since these are the junctions that are required to block voltage in a triac, it can be seen that the passivant is located to improve the voltage blocking capabilities of the assembly 300**.

The basic characteristics of triacs has been widely discussed in numerous patents and publications including SCR Manual, 4th Edition, published in 1967 by the General Electric Company. Accordingly, it is considered unnecessary to describe in detail the operative characteristics of the semiconductive assembly 300 beyond noting the contribution of certain salient features. The area 306A associated with the semiconductive assembly 300 provides a current flow path through the semiconductive crystal parallel to the gate and reduces the sensitivity of the semiconductive crystal to switching to the high conductivity mode in response to transient current or voltage pulses. The contact area 324 between the gate bonding assembly and the second layer 306 allows a lower gate signal to switch the semiconductive assembly 300 to its high conductivity mode when the junction between the gate layer and layer 306 is reverse biased. The area 324 is positioned at a somewhat remote location from the main portion of the layer 306 to avoid bringing the entire layer 306 to the potential of the gate.

The advantages of the semiconductive assembly 300 are similar to those discussed above with respect to semiconductive assembly 200. It is appreciated that instead of providing the passivant layer on a sloped edge the semiconductive assembly 300 could alternately be formed with the glass lying in a groove spaced from an edge similarly as in the semiconductive assembly 50.

While we have disclosed preferred semiconductive assemblies formed according to our invention associated with an exemplary semiconductor device as shown in FIG. 5, it is appreciated that our semiconductive assemblies have wide applicability to alternate semiconductor device configurations. It is to be noted that the vertical sectional views of semiconductive assemblies are somewhat schematic in character with the thickness of the semiconductive assemblies being greatly exaggerated as compared to the width, since semiconductive crystals are normally quite thin. In all instances the distance between the intersection of the peripheral portion of a juncture or junction with a groove and the intersection of a remaining junction or juncture with the same groove is preferably greater than the distance between the central portion of the junction and juncture and the remaining junction or juncture measured in a direction normal to the major surfaces. This relationship is generally desirable to allow preferential breakdown of a junction or juncture over its internal central portion. While we have disclosed our invention with specific reference to glass passivants, it is appreciated that any conventional junction passivant may be employed.

We claim and desire to secure by Letters Patent of the United States:

1. The combination comprising
- a semiconductive crystalline wafer having first and second major substantially parallel surfaces with a plurality of laterally spaced annular grooves associated with said second major surface, the grooves laterally defining therebetween a plurality of intersecting integral corridors, said semiconductive crystalline wafer being comprised of
- a plurality of laterally spaced first zones each spaced from said first major surface,
- a single second zone extending between said major surfaces along said corridors and lying adjacent said first major surface only interiorly of each of the annular grooves,
- said first and second major zones being of opposite conductivity type with said first zone being of higher resistivity than said second zone,
- said second zone forming a junction with each of said first zones,
- each of said junctions defining a central portion substantially parallel to said first major surface and a peripheral portion extending away from said first major surface toward said second major surface,
- said peripheral portion of each said junction intersecting one of the annular grooves to form an acute positive bevel angle within said higher resistivity first zone to enhance surface voltage blocking characteristics thereof, and
- dielectric passivant means overlying the intersections of said junctions with the grooves.

2. The combination according to claim 1 in which said semiconductive crystalline wafer includes a plurality of laterally spaced third zones of lower resistivity than said first zones each lying interiorly of the annular grooves adjacent said second major surface, of like conductivity type as said higher resistivity first zones, and forming junctures therewith, each of said junctures peripherally intersecting the surrounding annular groove, and the distance between the common groove intersections of said junctures and said junctions being greater than the thickness of said higher resistivity first zones measured in a direction normal to said first major surface.

3. The combination comprising
- a semiconductive crystalline wafer having first and second substantially parallel major surfaces with a plurality of laterally spaced annular grooves associated with said second major surface, the grooves laterally defining therebetween a plurality of intersecting integral corridors, said semiconductive crystalline wafer being comprised of
- a plurality of laterally spaced central zones each lying between and spaced from said major surfaces,
- a single first zone extending between said major surfaces along said corridors and lying adjacent said first major surface only interiorly of each of the annular grooves, said first zone forming a first junction with each of said central zones,
- a plurality of second zones each located laterally interiorly of the annular grooves along said second major surface and forming second junctions with said central zones,
- a plurality of third zones each located laterally interiorly of the annular grooves along said second major surface and forming third junctions with said second zones,
- each of said first junctions defining a central portion substantially parallel to said first major surface and a peripheral portion extending away from said first major surface toward said second major surface,
- said peripheral portion of each said first junction intersecting one of the annular grooves to form an acute positive bevel angle within said central zones to enhance surface voltage blocking characteristics of said first junctions, and
- dielectric passivant means overlying the intersections of said first junctions with the grooves.

4. The combination according to claim 3 in which said second junctions peripherally intersect the grooves and the distance between the common groove intersections of said first and second junctions is greater than the thickness of said central zones measured in a direction normal to said first major surface.

* * * * *